(12) United States Patent
Jonas et al.

(10) Patent No.: US 7,923,475 B2
(45) Date of Patent: Apr. 12, 2011

(54) ELECTROLUMINESCENT ARRANGEMENTS

(75) Inventors: Friedrich Jonas, Aachen (DE); Andreas Elschner, Mülheim (DE); Klaus Wussow, Netphen (DE); Rolf Wehrmann, Krefeld (DE)

(73) Assignee: H. C. Starck GmbH (DE)

( * ) Notice: Subject to any disclaimer, the term of this patent is extended or adjusted under 35 U.S.C. 154(b) by 0 days.

(21) Appl. No.: 10/057,027

(22) Filed: Jan. 24, 2002

(65) Prior Publication Data
US 2002/0136923 A1 Sep. 26, 2002

(30) Foreign Application Priority Data

Jan. 26, 2001 (DE) .................................. 101 03 416

(51) Int. Cl.
| B01F 3/12 | (2006.01) |
| C08G 75/06 | (2006.01) |
| C09K 11/06 | (2006.01) |
| H01B 1/12 | (2006.01) |
| H01L 51/50 | (2006.01) |

(52) U.S. Cl. ..................... 516/77; 252/500; 252/301.35; 524/547; 524/548; 525/186; 525/206

(58) Field of Classification Search .................... 516/77; 252/301.35, 500; 524/547, 548, 549, 553, 524/554; 525/186, 206
See application file for complete search history.

(56) References Cited

U.S. PATENT DOCUMENTS

| 5,187,184 A * | 2/1993 | Lovell ............................ 514/406 |
| 5,247,190 A | 9/1993 | Friend et al. .................... 257/40 |
| 5,300,575 A | 4/1994 | Jonas et al. .................... 525/186 |
| 5,312,681 A | 5/1994 | Muys et al. .................... 428/323 |
| 5,370,981 A | 12/1994 | Krafft et al. .................... 430/529 |
| 5,399,502 A | 3/1995 | Friend et al. .................... 437/1 |
| 5,567,355 A | 10/1996 | Wessling et al. ............. 252/500 |
| 5,766,515 A | 6/1998 | Jonas et al. .................... 252/500 |
| 6,083,635 A | 7/2000 | Jonas et al. .................... 428/690 |
| 6,391,481 B1 * | 5/2002 | Jonas et al. ............. 252/301.35 |
| 6,416,885 B1 * | 7/2002 | Towns et al. .................. 428/690 |
| 6,451,843 B1 | 9/2002 | Lieb et al. |
| 6,551,727 B2 * | 4/2003 | Towns et al. .................. 428/690 |
| 6,576,661 B1 | 6/2003 | Bruck et al. |
| 6,632,472 B2 * | 10/2003 | Louwet et al. ............. 427/126.1 |
| 7,053,174 B2 * | 5/2006 | Kirchmeyer et al. ......... 528/377 |
| 2002/0173579 A1 * | 11/2002 | Jonas et al. .................... 524/502 |
| 2004/0152832 A1 * | 8/2004 | Kirchmeyer et al. ......... 524/800 |
| 2004/0192830 A1 * | 9/2004 | Zhang ............................ 524/547 |
| 2006/0071201 A1 * | 4/2006 | Jonas et al. .................... 252/500 |
| 2007/0131914 A1 * | 6/2007 | Elschner et al. ............. 252/500 |

FOREIGN PATENT DOCUMENTS

| DE | 42 11 459 | 10/1993 |
| DE | 196 27 071 | 1/1998 |
| DE | 19818732 | 10/1999 |
| DE | 198 41 803 A1 * | 3/2000 |
| DE | 198 41 804 | 3/2000 |
| EP | 0492125 | 7/1992 |
| EP | 0553502 | 8/1993 |
| EP | 0 991 303 | 4/2000 |
| EP | 1 079 397 A1 * | 2/2001 |
| EP | 1079397 A1 * | 2/2001 |
| WO | WO-01/33966 | 5/2001 |

OTHER PUBLICATIONS

Smith et al, "Layer-by-Layer Assembly of Poly(3,4-ethylenedioxythiophene):Poly(styrenesulfonate)", Macromolecules 2006, 39, 6071-6074, (Published on Web Aug. 15, 2006), obtained online @ http://pubs.acs.org/journal/mamobx , (downloaded Sep. 2, 2010).*
Synthetic Metals, 92, (month unavailable) 1998, pp. 107-113, D. Braun, Crosstalk in passive Matrix polymer LED displays.
Colloid & Polymer Science, 267, (month unavailable) 1989, pp. 1113-1116, H.G Müller Automated determination of particle-size distributions of dispersions by analytical ultracentrifugation.
Science, vol. 279, Feb. 20, 1998, p. 1135, Self-Assembled LEDS Shine Brightly.
Synthetic Metals, 111-112 (month unavailable) 2000, pp. 139-143, A. Elschner, F. Bruder , H.-W. Heuer, F. Jonas, A. Karbach, S. Kirchmeyer, S. Thurm and R. Wehrmann, PEDT/PSS for efficient hole-injection in hybrid organic light-emitting diodes.

* cited by examiner

Primary Examiner — Daniel S Metzmaier
(74) Attorney, Agent, or Firm — Connolly Bove Lodge & Hutz LLP

(57) ABSTRACT

3,4-Polyalkylenedioxythiophene dispersions comprising polyanions and cationic 3,4-polyalkylenedioxythiophenes, in particular those of the formula (I)

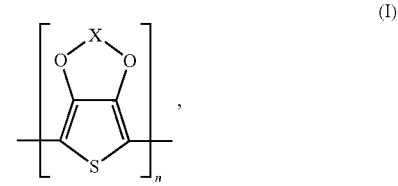

(I)

in which n is an integer from 3 to 100, preferably from 4 to 15, and

X is $-(CH_2)_x-CR^1R^2-(CH_2)_y-$, where $R^1$ and $R^2$, independently of one another, are H, an optionally substituted alkyl radical having from 1 to 20 carbon atoms, an aryl radical having from 6 to 14 carbon atoms or $-CH_2-OR^3$, where $R^3$=H, alkyl or $-CH_2-CH_2-CH_2-SO_3H$, and x and y are each, independently of one another, an integer from 0 to 9, in which at least 90% of the particles are <50 nm, can be employed in electroluminescent arrangements having a long service life and high luminosity.

4 Claims, No Drawings

ELECTROLUMINESCENT ARRANGEMENTS

CROSS REFERENCE TO RELATED PATENT APPLICATION

The present patent application claims the right of priority under 35 U.S.C. §119(a)-(d) of German Patent Application No. 101 03 416.4, filed Jan. 26, 2001.

FIELD OF THE INVENTION

The invention relates to electroluminescent arrangements which contain conductive polymers, especially 3,4-polyalkylenedioxythiophenes, as auxiliary layers, and to 3,4-polyalkylenedioxythiophene dispersions.

BACKGROUND OF THE INVENTION

An electroluminescent (EL) arrangement is characterized in that it emits light on application of an electric voltage with flow of a current.

Arrangements of this type have been known for some time under the term "light emitting diodes" (LEDs). The emission of light occurs through positive charges (holes) and negative charges (electrons) recombining with emission of light.

All the customary LEDs in industry predominantly consist of inorganic semiconductor materials. However, EL arrangements whose essential constituents are organic materials have been known for some years.

These organic EL arrangements generally contain one or more layers of organic charge-transport compounds.

The principal layer structure is as follows:
1 Support, substrate
2 Base electrode
3 Hole-injecting layer
4 Hole-transporting layer
5 Emitter layer
6 Electron-transporting layer
7 Electron-injecting layer
8 Top electrode
9 Contacts
10 Sheathing, encapsulation.

This construction represents the most general case and can be simplified by omitting individual layers so that one layer takes on a number of functions. In the simplest case, an EL arrangement consists of two electrodes between which is located an organic layer, which takes on all functions—including that of emission of light. Systems of this type are described, for example, in WO 90/13148 on the basis of poly[p-phenylene-vinylene].

In the production of large-area electroluminescent display elements, at least one of the current-carrying electrodes 2 or 8 must consist of a transparent and conductive material.

Suitable as substrate 1 are transparent supports, such as glass or plastic films (for example polyesters, such as polyethylene terephthalate or polyethylene naphthalate, polycarbonate, polyacrylate, polysulfone or polyimide film).

Suitable transparent and conductive electrode materials are:
a) metal oxides, for example indium tin oxide (ITO), tin oxide (NESA), etc.,
b) semi-transparent metal films, for example Au, Pt, Ag, Cu, etc.

Suitable emitter layers 5 are described, for example, in DE-A 196 27 071.

However, it has been found in practice that in order to increase the luminance, electron- or hole-injecting layers (3,4 and/or 6,7) have to be incorporated into the electroluminescent superstructures.

EP-A 686 662 discloses the use of specific mixtures of conductive organic polymeric conductors, such as 3,4-polyethylenedioxythiophene and polyhydroxyl compounds or lactams, as electrode 2 in electroluminescent displays. However, it has been found in practice that these electrodes do not have adequate conductivity, particularly for large-area displays. By contrast, the conductivity is sufficient for small displays (pixel size <1 mm$^2$).

DE-A 196 27 071 discloses the use of polymeric organic conductors, for example 3,4-polyethylenedioxythiophene, as hole-injecting layers. These enable the luminosity of the electroluminescent displays to be significantly increased compared with superstructures without the use of polymeric organic interlayers. However, the service life of these displays is still not adequate for practical applications.

EP-A 991 303 discloses 3,4-polyalkylenedioxythiophenes having particle sizes of <250 nm and conductivities of the dried polymers of <2 S/cm, corresponding to a resistivity of 0.5 Ωcm. However, for use in passive matrix displays, these 3,4-polyalkylenedioxythiophenes are still too conductive. The high conductivity results in so-called cross talk between adjacent conductor tracks (see, for example, D. Braun in Synth. Metals, 92 (1998) 107-113).

Surprisingly, it has now been found that by further reducing the size of the particles, the resistance of the 3,4-polyalkylenedioxythiophenes described in EP-A 991 303 can be significantly increased without the desired hole-injecting action being lost.

SUMMARY OF THE INVENTION

The invention relates to a dispersion comprising polyanions and cationic 3,4-polyalkylenedioxythiophenes, wherein at least about 90% of the particles of the dispersion are less than about 50 nm.

The invention also relates to an electroluminescent arrangement containing a hole-injecting layer, wherein the hole-injecting layer has been produced from a dispersion according to the invention.

These and other features, aspects, and advantages of the present invention will become better understood with reference to the following description and appended claims.

DETAILED DESCRIPTION OF THE INVENTION

The invention therefore relates to 3,4-polyalkylenedioxythiophene dispersions in which at least about 90% of the particles are less than about 50 nm and the resistivity of coatings produced therefrom is preferably more than about 5000 Ωcm. Preference is given to dispersions in which at least about 90% of the particles are less than about 40 nm.

The invention furthermore relates to electroluminescent arrangements which contain a hole-injecting layer produced from a dispersion according to the invention.

The particle size was determined in the swollen state by means of an ultracentrifuge. The general procedure is described in Colloid Polym. Sci. 267, 1113 to 1116 (1989). These dispersions were prepared starting from dispersions in accordance with EP-A 991 303 by subsequent comminution of the particles.

Suitable comminution methods are, for example, grinding by means of ball mills or stirred mills, high-speed stirring, ultrasound treatment and high-pressure homogenization.

Preference is given to high-pressure homogenization, in which the dispersion is forced one or more times through metal or ceramic nozzles under high pressure. The diameter of the nozzles is between about 1 and about 0.1 mm or, in the case of slot nozzles, the width is from about 0.1 to about 1 mm. The homogenization is carried out at pressures of from about 1 to about 2000 bar, preferably from about 100 to about 1000 bar.

In order to achieve the desired result, a plurality of passes may also be necessary.

The dispersions according to the invention preferably comprise polyanions and cationic, soluble or insoluble 3,4-polyalkylenedioxythiophenes of the formula I

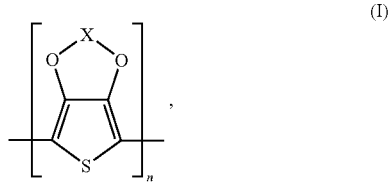

in which
n is an integer from 3 to 100, preferably from 4 to 15, and
X is $-(CH_2)_x-CR^1R^2-(CH_2)_y-$, where
$R^1$ and $R^2$, independently of one another, are H, an optionally substituted alkyl radical having from 1 to 20 carbon atoms, an aryl radical having from 6 to 14 carbon atoms or $-CH_2-OR^3$, where $R^3$=H, alkyl or $-CH_2-CH_2-CH_2-SO_3H$, and
x and y are each, independently of one another, an integer from 0 to 9.

Corresponding compounds are described in EP-A 440 957 and DE-A 4 211 459.

The 3,4-polyalkylenedioxythiophene dispersions according to the invention are preferably filtered through a filter before the coating operation.

In particular on use of the conductive polymers of the formula I in cationic form in combination with polyanions, preferably polyanions of polystyrenesulfonic acid, which can be prepared analogously to EP-A 440 957, it has been found that readily filterable dispersions are obtained if from about 6 to about 30 parts by weight of polyanion, preferably from about 8 to about 25 parts of polyanion, based on one part by weight of 3,4-polyalkylenedioxythiophene of the formula I, are used. The weight ratio of polycation to polyanion is thus preferably between about 1:8 and about 1:25.

This ratio of 3,4-polyalkylenedioxythiophene to polyanion can be set directly during the preparation. However, it has been found that it is also possible to start from a solution or dispersion having a higher content of 3,4-polyalkylenedioxythiophene and subsequently to set the ratio according to the invention of 3,4-polyalkylenedioxythiophene to polyanion by addition of polyanions.

The solids contents of the dispersions according to the invention are between about 0.01 and about 20% by weight, preferably between about 0.2 and about 5% by weight.

The viscosity of the dispersions at 20° C. is between the viscosity of pure water or the solvent mixture and 200 mPas, preferably less than about 100 mPas.

In order to set the desired solids content and the requisite viscosity, the desired amount of water can be removed from the aqueous dispersions by distillation, preferably under reduced pressure, or by another method, for example ultrafiltration.

Electroluminescent arrangements according to the invention contain a hole-injecting layer produced from a dispersion according to the invention.

The hole-injecting layer (3) is produced by known technologies. To this end, a dispersion according to the invention is distributed in the form of a film on a base electrode. The solvent used is preferably water or water/alcohol mixtures. Examples of suitable alcohols are methanol, ethanol, propanol, isopropanol and butanol.

The use of these solvents has the advantage that further layers or organic solvents, such as aromatic or aliphatic hydrocarbon mixtures, can then be applied without the layer (3) being attacked.

In addition, organic, polymeric binders and/or organic, low-molecular-weight crosslinking agents can be added to the dispersions according to the invention. Corresponding binders are described, for example, in EP-A 564 911.

The dispersions of the present invention preferably comprise only small amounts of ionic impurities in the limits as described in EP-A 991 303.

The dispersion according to the invention can be uniformly distributed on the substrate, for example by techniques such as spin coating, casting, knife coating, printing, curtain coating, etc. The layers can subsequently be dried at room temperature or temperatures up to 300° C., preferably from 100 to 200° C.

The conductivity of the hole-injecting layer (3) is determined by measuring the surface resistance of the layer. The following experimental set-up has proven particularly suitable for this purpose: the hole-injecting layer is coated in a layer thickness d of, for example, 200 nm onto an electrically insulating support, for example a glass substrate, and subsequently carefully dried at from 100 to 300° C. Metal strips are then vapor-deposited onto the layer as electrodes. Highly suitable are gold electrodes vapor-deposited as parallel strips in a vapor-deposition apparatus at a pressure of about $10^{-6}$ mbar with the aid of a mask. The strips have, for example, a length l of 20 mm, a width b of 3 mm and a separation a of 1.0 mm. The electrical resistance R of the layer is measured between two adjacent electrodes using either the two-pole or the four-pole method. In order to exclude the effect of atmospheric moisture, the resistance measurement is carried out in a dry atmosphere or in a vacuum. The surface resistance R is calculated in accordance with R=R·l/a, the conductivity σ in accordance with σ=1/(R·d), and the specific resistance R spec. in accordance with R spec.=R·d.

As an alternative to vapor-deposited metal electrodes, the measurement set-up can also be achieved by means of ITO electrodes. To this end, the ITO layer is structured on glass, for example as parallel strips, and the hole-injecting layer is subsequently coated on. The resistance between adjacent ITO electrodes is then measured as described above.

In order to set a certain conductivity of the hole-injecting layer, it has been found, surprisingly, that this can be achieved in a simple manner by mixing two solutions of the hole-injecting polymer in the correct ratio. The first solution must, as a layer, have higher conductivity than that desired, and the other solution must have a lower conductivity. The conductivity arising for the solution mixture follows in a linear manner from the volume proportion of the two individual solutions.

The dispersion according to the invention may in addition preferably be applied in a structured manner by techniques such as ink jet printing. This technique using water-soluble polythiophenes, such as 3,4-polyethylenedioxythiophene, is described, for example, in Science, Vol. 279, 1135, 1998, and DE-A 198 41 804.

On use of this coating technique, use is preferably made of poly-para-phenylenevinylene derivatives and/or polyfluorene derivatives as emitter layer 5 without the use of additional hole-transporting layers 4. This is because it has been found that on use of supports which have been coated over the entire surface with indium tin oxide and to which the conductive polymer layer has been applied in a structured manner, the emitter layer likewise applied over the entire surface subsequently only emits light at the points coated with the conductive polymer. This process enables structured electroluminescent displays to be produced in a simple manner without structuring of the conductive base electrode, for example by etching processes.

The thickness of the hole-injecting layer (3) is from about 3 to about 500 nm, preferably from about 10 to about 200 nm.

The further layers are subsequently applied to the hole-injecting layer (3) from solution or by vapor deposition. The emitter layer 5 used here preferably comprises poly-para-phenylenevinylene derivatives and/or polyfluorene derivatives without an additional hole-transporting layer 4, or aluminium complexes, such as aluminium quinolate, in combination with a hole-transporting interlayer 4.

The function of the hole-injecting interlayer can be tested in a special set-up (see also Synth. Met. 111 (2000) 139). To this end, the hole-injecting interlayer is applied by means of a spin coater to an ITO substrate that has been cleaned by wet-chemical methods. The layer is subsequently heated at 120° C. for 5 minutes. The layer thickness is 60 nm. A 1.5% by weight tetrahydrofuran solution of the hole-transport molecule current-voltage-luminance characteristic lines are recorded by means of a characteristic line plotter and a calibrated photodiode.

The organic light emitting diodes produced in accordance with the invention are distinguished by a long service life, high luminosity, low operational voltages and a high rectification ratio.

The invention is further described in the following illustrative examples in which all parts and percentages are by weight unless otherwise indicated.

EXAMPLES

Example 1

One (1) liter of a 1.4% by weight 3,4-polyethylenedioxythiophene/polystyrene sulfonate dispersion having a weight ratio of the 3,4-polyethylenedioxythiophene to polystyrenesulfonic acid of 1:8, prepared by evaporating a 3,4-polyethylenedioxythiophene/polystyrene sulfonate dispersion in accordance with Example 2 from EP-A 991 303, was homogenized twice using a high-pressure homogenizer at 700 bar and with a nozzle diameter of 0.1 mm. Example 2 of EP-A 991 303 states Preparation of the 3,4-Polyethylenedioxythiophene/
polystyrenesulfonate Dispersion (PEDT/PSS 1:8)

20 g of free polystyrenesulfonic acid (Mn about 40,000), 6.7 g of potassium peroxodisulfate, and 50 mg of iron(III)

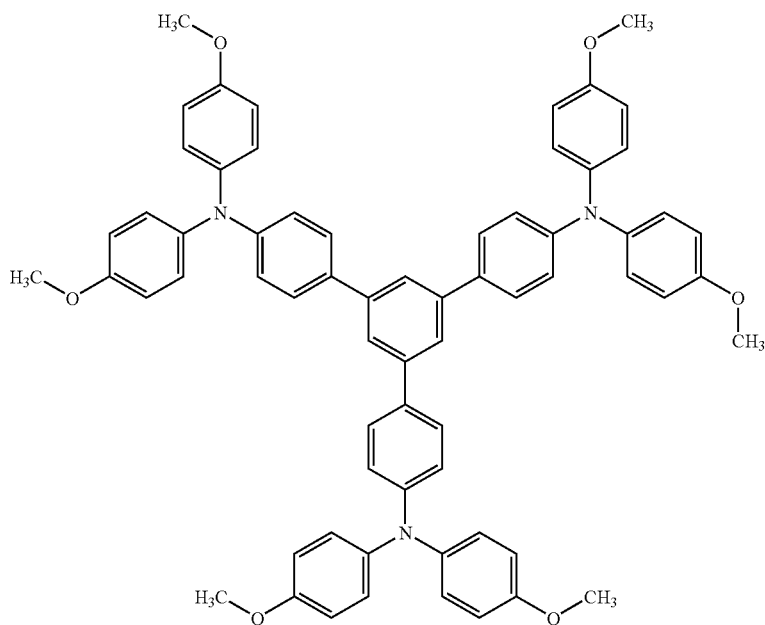

TDAPB is then applied by spin coating. The overall layer thickness is then 160 nm. Aluminium quinolate (Alq) is applied in the form of a layer with a thickness of 60 nm by vapor deposition as emitter layer. An alloy of Mg and Ag is subsequently applied as cathode by vapor deposition. By applying contacts to the indium tin oxide (ITO) anode and the metal cathode, sulfate were added to 2000 ml of water while stirring. 2.5 g of 3,4-ethylenedioxythiophene were then added while stirring. The dispersion was stirred at room temperature for 24 hours. Subsequently, 100 g of anion-exchange resin Lewatit® MP 62 (Bayer AG) and 100 g of cation-exchange resin Lewatit® S 100 (Bayer AG), both moist with water, were added and the mixture was stirred for 8 hours. The ion-exchange resins were removed by filtration through a poly-acrylonitrile fabric having a pore size of 50 µm. A dispersion was obtained having a solids content of about 1.1% by weight that was ready to use. The dispersion could easily be filtered through a 0.22 µm filter. The filtered dispersion was used for producing electroluminescent displays.

Coatings were subsequently applied to glass plates by spin coating and dried at 120° C., and the resistivity of the layers was determined under reduced pressure at about $10^{-6}$ mbar.

The use of this hole-injecting interlayer A in organic light emitting diodes was subsequently tested in a set-up consisting of the following multilayer stack: ITO//layer A (60 nm)//TDAPB(100 nm)//Alq(60 nm)//MgAg.

Example 2

1700 g of a 1.4% by weight 3,4-polyethylenedioxythiophene/polystyrene sulfonate solution prepared by evaporation of a 3,4-polyethylenedioxythiophene/polystyrene sulfonate dispersion in accordance with Example 2 from EP-A 991 303, having a weight ratio of the 3,4-polyethylenedioxythiophene to polystyrenesulfonic acid of 1:8, was mixed with stirring with 659.4 g of a 4.8% by weight aqueous polystyrenesulfonic acid solution in such a way that the weight ratio of 3,4-polyethylenedioxythiophene to polystyrene sulfonate in the solution is 1:20. The resultant solution was homogenized 4 times using a high-pressure homogenizer at 400 bar and with a nozzle diameter of 0.2 mm.

Coatings were subsequently produced on glass plates by spin coating and dried at 120° C., and the resistivity of the layers was determined under reduced pressure at about $10^{-6}$ mbar.

The use of this hole-injecting interlayer B in organic light emitting diodes was subsequently tested in a set-up consisting of the following multilayer stack: ITO//layer B (60 nm)//TDAPB(100 nm)//Alq(60 nm)//MgAg.

Example 3

2000 g of a 1.4% by weight 3,4-polyethylenedioxythiophene/polystyrene sulfonate solution prepared by evaporation of a 3,4-polyethylenedioxythiophene/polystyrene sulfonate dispersion in accordance with Example 2 of EP-A 991 303, having a weight ratio of the 3,4-polyethylenedioxythiophene to polystyrenesulfonic acid of 1:8, was mixed with stirring with 259 g of a 4.8% by weight aqueous polystyrene-sulfonic acid solution in such a way that the weight ratio of 3,4-polyethylenedioxythiophene to polystyrene sulfonate in the solution is 1:12. The resultant solution was homogenized 4 times using a high-pressure homogenizer at 400 bar and with a nozzle diameter of 0.2 mm.

Coatings were subsequently produced on glass plates by spin coating and dried at 120° C., and the resistivity of the layers was determined under reduced pressure at about $10^{-6}$ mbar.

The use of this hole-injecting interlayer C in organic light emitting diodes was subsequently tested in a set-up consisting of the following multilayer stack:
ITO//layer C (60 nm)//TDAPB(100 nm)//Alq(60 nm)//MgAg.

The results obtained are shown in the following Table 1:

TABLE 1

| Example | 90% of the particles in the dispersion in the swollen state < x nm | Resistivity [Ωcm] | Efficiency @ 5 V [cd/A] | Service life-half-value period @ 8 mA/cm² [h] |
|---|---|---|---|---|
| Example 2 from EP-A 991 303 (comparison) | 72 | 980 | 1.47 | 650 |
| 1 | 35 | 8300 | 1.47 | 650 |
| 2 | 34 | 101000 | 1.50 | 600 |
| 3 | 35 | 37000 | 1.45 | 700 |

Efficiency=luminosity of the electroluminescent display in candelas/ampere, measured at an applied voltage of 5 volts. Service life=time in hours until the luminosity of the electroluminescent displays at a constant current of 8 mA/cm² has dropped to half.

It is clear that the increased resistance of the interlayers for avoiding cross talk between adjacent lines (Examples 1-3) does not have an adverse effect on the efficiency and service life of the light emitting diodes.

Although the present invention has been described in detail with reference to certain preferred versions thereof, other variations are possible. Therefore, the spirit and scope of the appended claims should not be limited to the description of the versions contained therein.

What is claimed is:

1. A dispersion comprising:
   polyanions;
   cationic 3,4-polyalkylenedioxythiophenes; and
   a solvent comprising water and optionally alcohol,
   wherein said dispersion has a weight ratio of cationic 3,4-polyalkylene-dioxythiophene to polyanion of from 1:8 to 1:25, and 90% by weight of the particles of the dispersion being less than 40 nm.

2. The dispersion according to claim 1, wherein the 3,4-polyalkylenedioxythiophenes are represented by formula (I),

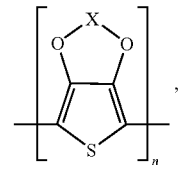

(I)

wherein,
n is an integer from 3 to 100, and
X is —(CH$_2$)$_x$—CR$^1$R$^2$—(CH$_2$)$_y$—, wherein
   R$^1$ and R$^2$, independently of one another, are selected from the group consisting of H, an optionally substituted alkyl radical having from 1 to 20 carbon atoms, an aryl radical having from 6 to 14 carbon atoms, and
   —CH$_2$-OR$^3$,
   wherein R$^3$ is selected from the group consisting of H, alkyl and
   —CH$_2$—CH$_2$—CH$_2$—SO$_3$H,
   and
   x and y are each, independently of one another, an integer from 0 to 9.

3. The dispersion according to claim 2, wherein n is an integer from 4 to 15.

4. The dispersion according to claim 1, wherein the dispersion is a 3,4-polyethylenedioxythiophene/polystyrene sulfonate dispersion.

* * * * *